(12) United States Patent
Brüderl et al.

(10) Patent No.: US 8,012,256 B2
(45) Date of Patent: Sep. 6, 2011

(54) METHOD OF FABRICATING A QUASI-SUBSTRATE WAFER AND SEMICONDUCTOR BODY FABRICATED USING SUCH A QUASI-SUBSTRATE WAFER

(75) Inventors: Georg Brüderl, Burglengenfeld (DE); Christoph Eichler, Tegernheim (DE); Uwe Strauss, Bad Abbach (DE)

(73) Assignee: Osram Opto Semiconductor GmbH, Regensburg (DE)

( * ) Notice: Subject to any disclaimer, the term of this patent is extended or adjusted under 35 U.S.C. 154(b) by 1204 days.

(21) Appl. No.: 11/668,718

(22) Filed: Jan. 30, 2007

(65) Prior Publication Data

US 2007/0175384 A1 Aug. 2, 2007

(30) Foreign Application Priority Data

Jan. 31, 2006 (DE) .......................... 10 2006 004 398
Feb. 16, 2006 (DE) .......................... 10 2006 007 293

(51) Int. Cl.
*C30B 29/06* (2006.01)
(52) U.S. Cl. ................ 117/74; 117/75; 117/76; 117/80; 117/82; 117/88
(58) Field of Classification Search ............... 117/74–88
See application file for complete search history.

(56) References Cited

U.S. PATENT DOCUMENTS

| | | | | |
|---|---|---|---|---|
| 5,374,564 A | * | 12/1994 | Bruel ............................ | 438/455 |
| 5,494,835 A | * | 2/1996 | Bruel ............................ | 156/250 |
| 5,804,086 A | * | 9/1998 | Bruel ............................ | 216/33 |
| 5,854,123 A | * | 12/1998 | Sato et al. ..................... | 438/507 |
| 5,863,830 A | * | 1/1999 | Bruel et al. ................... | 438/478 |
| 5,909,627 A | * | 6/1999 | Egloff ........................... | 438/406 |
| 6,103,597 A | * | 8/2000 | Aspar et al. ................... | 438/458 |
| 6,429,104 B1 | * | 8/2002 | Auberton-Herve ........... | 438/527 |
| 6,593,212 B1 | * | 7/2003 | Kub et al. ..................... | 438/458 |
| 6,700,631 B1 | * | 3/2004 | Inoue et al. ................... | 349/45 |

(Continued)

FOREIGN PATENT DOCUMENTS

DE 199 59 182 6/2001

(Continued)

OTHER PUBLICATIONS

Suprun-Belevich et al. "Evolution of mechanical strain and extended defects in annealed (100) silicon samples implanted with Ge+ ions". *Nuclear Instruments and Methods in Physics Research B* 140:91-98, 1998.

(Continued)

*Primary Examiner* — Robert M Kunemund
(74) *Attorney, Agent, or Firm* — Fish & Richardson P.C.

(57) ABSTRACT

Disclosed are a method of fabricating a quasi-substrate wafer with a subcarrier wafer and a growth layer, and a semiconductor body fabricated using such a quasi-substrate wafer. In the method of fabricating a quasi-substrate wafer, a growth substrate wafer is fabricated that is provided with a separation zone and comprises the desired material of the growth layer. The growth substrate wafer is provided with a stress that counteracts a stress generated by the formation of the separation zone, and/or the stress generated by the formation of the separation zone is distributed, by structuring a first main race of the growth substrate water and/or the separation zone, to a plurality of subregions along the first main face. The growth substrate wafer with separation zone exhibits no or only slight bowing.

30 Claims, 3 Drawing Sheets

U.S. PATENT DOCUMENTS

| | | | |
|---|---|---|---|
| 6,756,286 B1 * | 6/2004 | Moriceau et al. | 438/459 |
| 6,770,542 B2 * | 8/2004 | Plossl et al. | 438/458 |
| 6,890,835 B1 * | 5/2005 | Chu et al. | 438/458 |
| 6,936,482 B2 * | 8/2005 | Auberton-Herve | 438/14 |
| 7,221,038 B2 * | 5/2007 | Auberton-Herve | 257/618 |
| 7,307,273 B2 * | 12/2007 | Currie | 257/18 |
| 7,329,587 B2 * | 2/2008 | Bruederl et al. | 438/458 |
| 7,427,554 B2 * | 9/2008 | Henley et al. | 438/457 |
| 7,588,994 B2 * | 9/2009 | Langdo et al. | 438/406 |
| 2003/0119217 A1 * | 6/2003 | Plossl et al. | 438/22 |
| 2003/0129780 A1 * | 7/2003 | Auberton-Herve | 438/46 |
| 2005/0112848 A1 * | 5/2005 | Faris | 438/458 |
| 2005/0151155 A1 * | 7/2005 | Auberton-Herve | 257/103 |
| 2006/0148156 A1 * | 7/2006 | Gunter et al. | 438/199 |
| 2006/0211159 A1 * | 9/2006 | Bruederl et al. | 438/35 |
| 2007/0037323 A1 * | 2/2007 | Henley et al. | 438/149 |
| 2007/0090396 A1 * | 4/2007 | Linder et al. | 257/185 |
| 2007/0175384 A1 * | 8/2007 | Bruderl et al. | 117/89 |
| 2009/0117711 A1 * | 5/2009 | Harle et al. | 438/463 |
| 2009/0309113 A1 * | 12/2009 | Eichler et al. | 257/98 |
| 2010/0009404 A1 * | 1/2010 | Hans et al. | 435/43 |
| 2010/0065890 A1 * | 3/2010 | Linder et al. | 257/201 |

FOREIGN PATENT DOCUMENTS

| | | |
|---|---|---|
| DE | 100 20 464 | 8/2001 |
| DE | 100 51 465 | 2/2002 |
| WO | WO 98/14986 | 4/1998 |
| WO | WO 2005/004231 | 1/2005 |

OTHER PUBLICATIONS

Turner et al. "Modeling of direct wafer bonding: Effect of wafer bow and etch patterns". *Journal of Applied Physics*, 92(12):7658-7666, 2002.

Wang et al. "Nature of Planar Defects in Ion-Implanted GaN". *Electromechanical and Solid-State Letters* 6(3):G34-G36, 2003.

Harutyunyan et al. "High-resolution x-ray diffraction strain-stress analysis of GaN/sapphire heterostructures". *Journal of Physics D: Applied Physics*, 34:A35-A39, 2001.

Goesele et al. "Semiconductor Wafer Bonding". *Annu. Rev. Mater. Sci.* 28:514-241, 1998.

Kucheyev et al. "Dynamic annealing in ill-nitrides under ion bombardment". *Journal of Applied Physics*, 95(6):3048-3054, 2004.

Jursenas et al. "Optical gain in homoepitaxial GaN". *Applied Physics Letters*, 85(6):952-954, 2004.

Kucheyev et al. "Blistering of H-implanted GaN". *Journal of Applied Physics*, 91(6):3928-3930, 2002.

Pearton et al. "GaN: Processing, defects, and devices". *Journal of Applied Physics*, 86(1):1-78, 1999.

Jain et al. "III-nitrides: Growth, characterization, and properties". *Journal of Applied Physics*, 87(3):965-1006, 2000.

Gibart. "Metal organic vapour phase epitaxy of GaN and lateral overgrowth". *Reports on Progress in Physics*, 67:667-715, 2004.

Grandjean et al. "GaN/AlGaN quantum wells for UV emission: heteroepitaxy *versus* homoepitaxy". *Semiconductor Science and Technology*, 16:358-361, 2001.

Nastasi et al. "Nucleation and growth of platelets in hydrogen-ion-implanted silicon". *Applied Physics Letters*, 86:154102, 2005.

Liu et al. "Substrates for gallium nitride epitaxy". *Materials Science and Engineering*, R37:61-127, 2002.

Keckes et al. "Temperature dependence of stresses in GaN thin films grown on (0001) sapphire: Modeling of thermal stresses". *Applied Physics Letters*, 79(26):4307-4309, 2001.

Radu et al. "Low-temperature layer splitting of (100) GaAs by He+H coimplantation and direct wafer bonding". *Applied Physics Letters*, 82(15):2413-2415, 2003.

Chen et al. "Study of damage and stress induced by backgrinding in Si wafers". *Semiconductor Science and Technology*, 18:261-268, 2003.

Di Cioccio et al. "Silicon carbide on insulator formation using the Smart Cut process". *Electronics Letters*, 32(12):1144-1145, 1996.

Ronning et al. "Ion implantation into gallium nitride". *Physics Reports*, 351:349-385, 2001.

Volkert. "Stress and plastic flow in silicon during amorphization by ion bombardment". *J. Appl. Phys.*, 70(7):3521-3527, 1991.

Tauzin et al. "Transfers of 2-inch GaN films onto sapphire substrates using Smart Cut™ technology". *Electronics Letters*, 41(11):668-670, 2005.

Bruel. "Silicon on insulator material technology". *Electronics Letters*, 31(14):1201-1202, 1995.

Singh et al. "Investigation of hydrogen implantation induced blistering in GaN". *Phys. Stat. Sol. (c)*, 3(6):1754-1757, 2006.

Tong et al. "Low temperature InP layer transfer". *Electronics Letters*, 35(4):341-342, 1999.

* cited by examiner

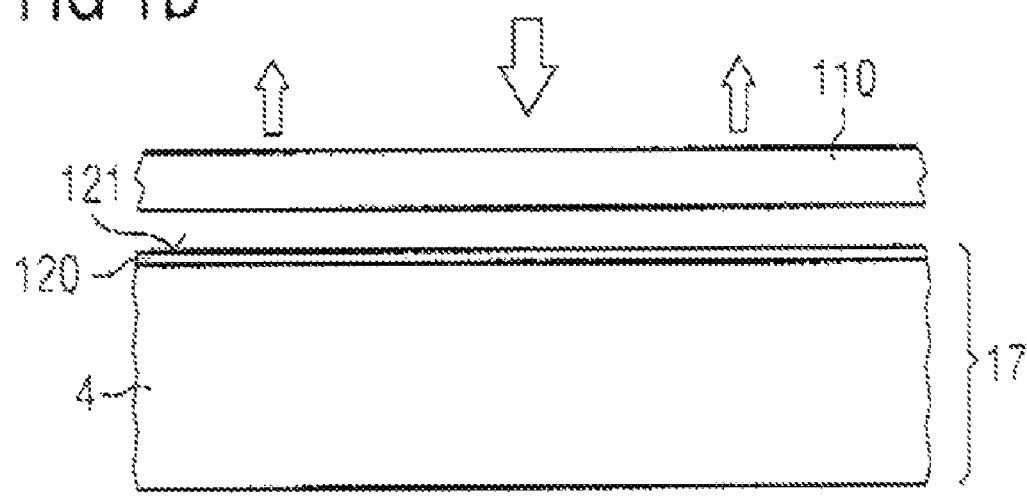
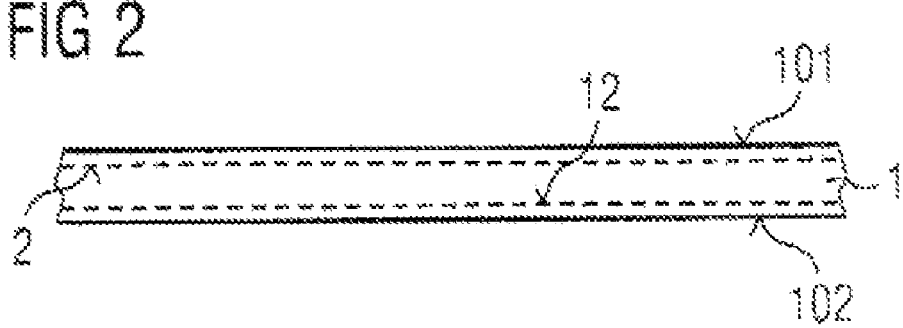
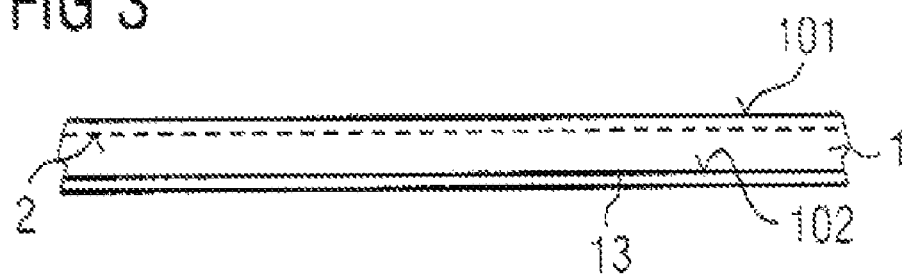

METHOD OF FABRICATING A QUASI-SUBSTRATE WAFER AND SEMICONDUCTOR BODY FABRICATED USING SUCH A QUASI-SUBSTRATE WAFER

CROSS REFERENCE TO RELATED APPLICATIONS

This patent application claims foreign priority benefits under Title 35 U.S.C. to German Patent Application No. 10 2006 004 398.7, filed Jan. 31, 2006, and German Patent Application No. 10 2006 007 293.6, filed Feb. 16, 2006. The contents of these patent applications is hereby incorporated by reference in their entirety.

FIELD OF THE INVENTION

The invention concerns a method of fabricating a quasi-substrate wafer, and a semiconductor body fabricated using such a quasi-substrate wafer.

BACKGROUND OF THE INVENTION

During the performance of a method of fabricating a plurality of semiconductor bodies on a quasi-substrate wafer, a growth substrate wafer used to make the quasi-substrate wafer may become bowed. For example, WO 2005/004231, whose disclosure content is hereby incorporated by reference into this application, describes such a method in which a separation zone is formed in the growth substrate wafer. The formation of the separation zone can for example lead to stresses in the growth substrate wafer and bow it.

Bowing of the growth substrate wafer can for example hinder or even prevent bonding of the growth substrate wafer to the auxiliary substrate wafer during the fabrication of the quasi-substrate wafer. This creates the risk that the auxiliary substrate wafer and a growth substrate wafer that exhibits bowing may not enter into a bond that covers the greatest possible area and/or has the greatest possible mechanical stability.

An object of the present invention is, therefore, to provide an improved method of fabricating a growth substrate wafer a with separation zone that makes it possible to fabricate growth substrate wafers which can be bonded to a subcarrier wafer in as simple and secure a manner as possible.

SUMMARY OF THE INVENTION

In a first method of fabricating a quasi-substrate wafer with a subcarrier wafer and a growth layer, according to the invention:

- a growth substrate wafer comprising the desired material of the growth layer and having a first main face and a second main face is prepared;
- a separation zone disposed along the first main face is formed in the growth substrate wafer;
- the growth substrate wafer is provided with a stress that counteracts a stress generated in the growth substrate wafer by the formation of the separation zone;
- the growth substrate wafer is bonded to the subcarrier wafer with the first main face of the growth substrate wafer facing the subcarrier wafer; and
- a portion of the growth substrate wafer that faces away from the subcarrier wafer, as viewed from the separation zone, is detached along the separation zone.

A quasi-substrate wafer comprises in the present case at least one thin semiconductor film, serving for example as a growth layer. The quasi-substrate wafer preferably also comprises a subcarrier wafer on which the thin semiconductor film is disposed. The subcarrier wafer can for example serve to increase the mechanical stability of the quasi-substrate wafer.

The phrase "the separation zone is disposed along the first main face" means that the separation zone is disposed in the growth substrate wafer such that it is parallel or nearly parallel to the first main face of the growth substrate wafer. Deviations from parallelity between the separation zone and the first main face of the growth substrate wafer can occur for example if the separation zone is formed in a growth substrate wafer that exhibits a bowing prior to the formation of the separation zone.

As a rule, bowed growth substrate wafer has a first main face and a second main face that are bowed substantially paroboloidally or in the shape of a segment of a sphere. The bowing can also, however, deviate from a rotationally symmetrical shape. For example, the bowing may be such that it is of different magnitudes along different principal axes of the growth substrate wafer.

The bowing of the first main face of the growth substrate wafer can for example be convex. The second main face is then correspondingly concavely curved. Such a concave curvature is characterized by the fact that the line connecting any two points on the main face extends completely outside the growth substrate.

A main face of a bowed growth substrate wafer has a radius of curvature that is given by the radius of that circle which at its center point best approximates the curved main face along the direction of greatest curvature.

The formation of the separation zone causes a stress that leads to a first change in the radius of curvature of the first main face of the growth substrate wafer. For example, if the separation zone is formed in a flat growth substrate wafer, the stress caused by the formation of the separation zone usually reduces the magnitude of the radius of curvature of the first main face.

Before or after the formation of the separation zone, the growth substrate wafer is provided with a stress that counteracts the stress caused by the formation of the separation zone and brings about a second change in the radius of curvature of the first main face of the growth substrate wafer.

The second change in the radius of curvature is opposite in direction to the first change in the radius of curvature. Consequently, the growth substrate wafer in which the separation zone is formed and which is provided with a stress is advantageously flat or its bowing is reduced, at least in comparison to the bowing exhibited by a growth substrate wafer in which the separation zone is formed and which is not provided with a stress. It may happen under these circumstances that the growth substrate wafer in which the separation zone is formed and which is provided with a stress exhibits a bowing of opposite direction to the bowing produced by the formation of the separation zone in a growth substrate wafer not provided with a stress.

Fabricating a growth substrate wafer with separation zone that is flat or exhibits only a light bowing improves the process of fabricating a quasi-substrate wafer. For example, it ensures simple bonding of the growth substrate wafer to the subcarrier wafer with the greatest possible area coverage and/or mechanical stability.

The effects of the stress generated by the formation of the separation zone and the stress with which the growth substrate wafer is provided preferably offset each other almost completely. Hence, the first and second changes in the radius of curvature of the first main face of the growth substrate wafer substantially cancel each other out.

High plurality of the first main face of the growth substrate wafer can be achieved in this way.

In a particularly preferred embodiment, a growth substrate wafer is prepared which at the time of preparation already exhibits a stress that causes a second change in the radius of curvature, such that the first main face of the prepared growth substrate wafer is curved. For example, the growth substrate wafer can be provided with such a stress during its fabrication. The prepared growth substrate wafer is preferably stressed such that its first main face has a concave curvature.

The formation of the separation zone in a flat growth substrate wafer can for example produce a convex bowing of the first main face. When the separation zone is formed in a growth substrate wafer that is, for example, stressed such that its first main surface is concavely curved, the growth substrate wafer is then advantageously bent flat and exhibits only slight or no bowing after the formation of the separation zone.

In a further embodiment of the method, a second zone is formed along the first main face of the growth substrate wafer, which second zone generates in the growth substrate wafer a stress that counteracts the stress generated by the formation of the separation zone. This stress brings about a second change in the radius of curvature of the first main face of the growth substrate wafer that is opposite in direction to the first change in the radius of curvature.

The phrase "the formation of the second zone takes place along the second main face of the growth substrate wafer" means in the present instance, analogously to the formation of the separation zone, that the second zone extends parallel or nearly parallel to the second main face of the growth substrate wafer. Deviations from parallelity between the second zone and the second main face of the growth substrate wafer can occur for example if the second zone is formed in a growth substrate wafer that exhibits a bowing prior to the formation of the second zone.

The second zone is preferably formed in a similar manner to the separation zone. Particularly preferably, the second zone formed in a similar manner to the separation zone does not differ substantially in its construction from the separation zone. For example, the geometric dimensions of the second zone are substantially the same as those of the separation zone. Furthermore, the second zone is preferably formed by the same production method as the separation zone, particularly preferably using comparable process parameters.

The magnitude of the stress generated by the formation of the second zone is then usually substantially the same as the magnitude of the stress generated by the formation of the separation zone.

In a particularly preferred embodiment, the separation zone and the second zone are disposed symmetrically or nearly symmetrically to a plane extending centrally between the first main face and the second main face of the growth substrate wafer, said second main face being disposed oppositely to said first main face.

"Nearly symmetrically" means in this context that deviations from a completely symmetrical arrangement of the separation zone and the second zone may occur if the separation zone and/or the second zone are only nearly parallel to the first main face, because, for example, the separation zone and/or the second zone are formed in a growth substrate wafer that exhibits a bowing prior to the formation of the separation zone or the second zone.

Forming the second zone along the second main face of the growth substrate wafer makes it possible for example to induce a stress that bows a flat growth substrate wafer such that the second main face exhibits a convex bowing and the first main face is concave bowing. This stress is advantageously opposite in direction to the stress generated by the formation of the separation zone, if the later is for example directed such that it convexly curves the first main face of a flat growth substrate wafer. After the formation of the separation zone and the second zone, the growth substrate wafer is advantageously flat or only slightly bowed.

In a further embodiment, a stressed layer that generates in the growth substrate wafer a stress that counteracts the stress generated by the formation of the separation zone is applied to at least one main face of the growth substrate wafer. This brings about a second change in the radius of curvature of the first main face of the growth substrate wafer that is opposite in direction to the first change in the radius of curvature.

In a preferred embodiment, the stressed layer is applied to the second main face of the growth substrate wafer. Particularly preferably, the stressed layer applied to the second main face of the growth substrate wafer is compressively stressed.

In a further preferred embodiment, the stressed layer is applied to the first main face of the growth substrate wafer. Particularly preferably, the stressed layer applied to the first main face of the growth substrate wafer is tensilely stressed.

The stressed layer applied to at least one main face of the growth substrate wafer can be for example a dielectric layer. It can also comprise or consist of at least one metal nitride and/or metal oxide. The stressed layer preferably comprises or consists of at least one of the following materials: SiN, SiO, TiN.

In a second method of fabricating a quasi-substrate wafer comprising a subcarrier wafer and a growth layer, according to the invention a growth substrate wafer comprising the desired material of the growth layer and having a first main face and a second main face is prepared;

a separation zone disposed along the first main face is formed in the growth substrate wafer;

a stress generated in the growth substrate wafer by the formation of the separation zone is distributed, by means of a structuring of the first main face and/or the separation zone, substantially to a plurality of subregions disposed along the first main face;

the growth substrate wafer is bonded to the subcarrier with the first main face of the growth substrate wafer facing the subcarrier wafer; and a portion of the growth substrate wafer that faces away from the subcarrier wafer, as viewed from the separation zone, is detached along the separation zone.

The structuring is preferably effected by means of linear defects in the first main face and/or the separation zone. The linear defects can for example be arranged in parallel or can form a grid. A subregion of the structure is bounded by linear defects and exhibits no further linear defects.

Without the distribution to plural subregions disposed along the first main face, the formation of the separation zone would generate a stress that would bring about a first change in the radius of curvature of the first main face of the growth substrate wafer. However, the stress generated by the formation of the separation zone occurs substantially within the subregions of the structure. The stress can be at least partially alleviated between these subregions disposed along the first main face, and the first main face on the whole exhibits no or only slight bowing.

In one embodiment of the method, in addition to the distribution of the stress generated in the growth substrate wafer by the formation of the separation zone by means of a structuring of the first main face and/or the separation zone substantially to a plurality of subregions disposed along the first main face, the growth substrate wafer is provided with a stress that counteracts a stress generated in the growth substrate wafer by the formation of the separation zone.

The growth substrate wafer can, for example, in addition to the structuring of the first main face and/or the separation zone, be provided with a stress by preparing a growth substrate wafer that already exhibits a stress prior to the formation of the separation zone, forming a second zone along the second main face of the growth substrate wafer and/or applying a stressed layer to at least one main face of the growth substrate wafer, as described above.

If, for example, a first change in the radius of curvature of the first main face of the growth substrate is not completely prevented by structuring the first main face of the growth substrate wafer and/or the separation zone, the expedient of additionally providing the growth substrate wafer with a stress can serve to bring about a second change in the radius of curvature of the first main face that makes it possible to achieve particularly high planarity of the growth substrate wafer.

All subregions of the structure can have substantially the same side lengths, or the side lengths of different subregions can be different. For instance, the side lengths of a subregion in sections of the first main face that are intended for the subsequent growth of semiconductor bodies can be selected to be so large that one or more semiconductor bodies can be formed completely within a subregions of the structure. In other sections of the first main face on which no growth of semiconductor bodies is to take place, the side lengths of the subregions can for example be selected to be smaller. The subregions of the structure preferably have side lengths of between 100 μm and 1 cm, limits included. Particularly preferably, the sides of the subregions have a side length of 5 mm.

The structuring of the first main face of the growth substrate wafer is preferably effected by means excavations, particularly pits or trenches, particularly produced by etching.

The excavations preferably have a depth that is selected to be smaller than the distance of the separation zone from the first main face of the growth substrate wafer.

Thus, when the portion of the growth substrate wafer that faces away from the subcarrier wafer, as viewed from the separation zone, is removed, a closed surface of the growth substrate wafer remains even though the first main face is structured.

The structure of the first main face of the growth substrate wafer and/or the separation zone preferably represents a grid. The grid can for example be formed of parallelograms, rectangles, squares or triangles as subregions. The grid can be formed as a regular grid.

The bowing of the growth substrate wafer can also be at least partially offset by a mechanical method, for example by exerting uniaxial pressure on the growth substrate wafer. As a rule, however, such mechanical methods are applicable only in the case of small degrees of bowing. In addition, they entail a higher risk of destroying the growth substrate wafer than the other described methods of compensating for bowing.

Such a mechanical method becomes unnecessary if a growth substrate wafer with separation zone is fabricated that exhibits no or only slight bowing because it is provided with a stress that counteracts the stress generated by the formation of the separation zone and/or the stress generated in it by the formation of the separation zone is distributed to a plurality of subregions along the first main face.

In a preferred embodiment of the method, a growth substrate wafer with separation zone is fabricated whose first main face has a radius of curvature greater than or equal to 35 m. Particularly preferably, the radius of curvature of the first main face of the growth substrate wafer with separation zone is greater than or equal to 70 m.

In a preferred embodiment, the growth substrate wafer comprises or consists of a nitride III compound semiconductor material. Particularly preferably, said nitride III compound semiconductor material is GaN and/or AlN. The growth substrate wafer preferably substantially comprises semiconductor material that is identical or similar, particularly in terms of its lattice parameters, to a semiconductor material system intended for the subsequent epitaxial growth of a semiconductor layer sequence.

In a particularly preferred embodiment, the separation zone and/or the second zone is produced by ion implantation. For example, hydrogen ions can be implanted. A suitable dose of implanted ions assumes a value equal to or greater than $10^{17}$ ions/cm$^2$.

According to one embodiment of the method, the stress generated in the prepared growth substrate wafer by the formation of the separation zone is so selected that the formation of an unstructured separation zone in a flat growth substrate wafer bows its first main face such that it has a radius of curvature between 3 m and 35 m, limits included.

The first main face of the growth substrate wafer and the subcarrier wafer need not be in direct contact with each other for the growth substrate wafer to be bonded to the subcarrier wafer. For example, the bond between the growth substrate wafer and the subcarrier wafer can be created by means of a bonding layer. Said bonding layer can for example be a dielectric layer. It preferably comprises silicon oxide and/or silicon nitride or consists of silicon oxide and/or silicon nitride. The bonding layer can also comprise or consist of at least one metal oxide and/or metal nitride.

In another preferred embodiment, the portion of the growth substrate wafer facing away from the subcarrier wafer, as viewed from the separation zone, is thermally cleaved along the separation zone.

In a particularly preferred embodiment, a growth surface for subsequent epitaxial growth of a semiconductor layer sequence, for example for fabricating a plurality of semiconductor bodies, is formed on the portion of the growth substrate wafer that remains on the subcarrier wafer. The growth surface can be formed for example by etching and/or grinding.

Further advantages and advantageous embodiments and improvements of the invention will emerge from the exemplary embodiments described hereinafter in conjunction with FIGS. 1A to 5.

BRIEF DESCRIPTION OF THE DRAWINGS

FIGS. 1A to 1D are schematic sectional representations of a quasi-substrate wafer at various stages of the first inventive method in accordance with a first exemplary embodiment, FIG. 2 is a schematic sectional representation of a growth substrate wafer during a method step according to a second exemplary embodiment of the first method, FIG. 3 is a schematic sectional representation of a growth substrate wafer during a method step according to a third exemplary embodiment of the first method.

DETAILED DESCRIPTION OF THE PREFERRED EMBODIMENTS

Figure 1A:
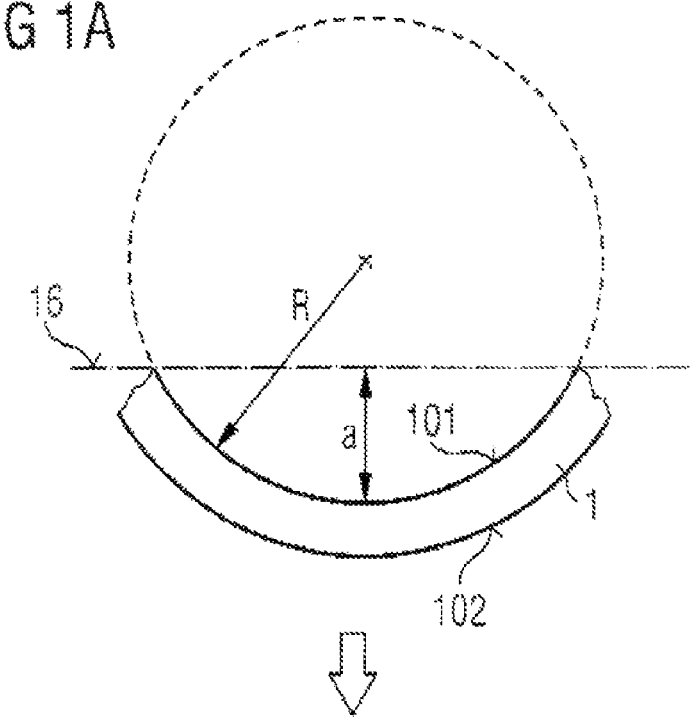

In the exemplary embodiments and figures, like or like-acting elements are identified in the same way and provided with the same respective reference numerals. The depicted elements and their size relationships to one another are basically not to be considered true to scale, but rather, individual elements, such as layers, for example, may be depicted as exaggeratedly large or exaggeratedly curved for the sake of better visualization and/or better understanding.

In a method according to the first exemplary embodiment of the first inventive method, depicted in FIGS. 1A to 1D, a quasi-substrate wafer with a subcarrier wafer and a growth layer is fabricated.

First, a growth substrate wafer 1 having a first main face 101 and a second main face 102 is prepared from a nitride III compound semiconductor material, for example GaN or AlN. The growth substrate wafer 1 exhibits a stress that concavely bows first main face 101, as shown by FIG. 1A. Both first main face 101 and second main face 102 are surfaces that are curved paraboloidally or in the shape of a segment of a sphere. The first main face 101 of the prepared growth substrate wafer 1 in this case has a radius R of curvature that preferably assumes a value between 3 m and 35 m, particularly preferably between 6 m and 10 m, limits included. In the case of a growth substrate wafer 1 with a diameter of 2 inches, this curvature roughly corresponds to a maximum distance a of first main face 101 from a planar underlayer 16 that assumes a value between 10 μm and 100 μm, particularly between 30 μm and 60 μm, limits included.

Figure 1B:
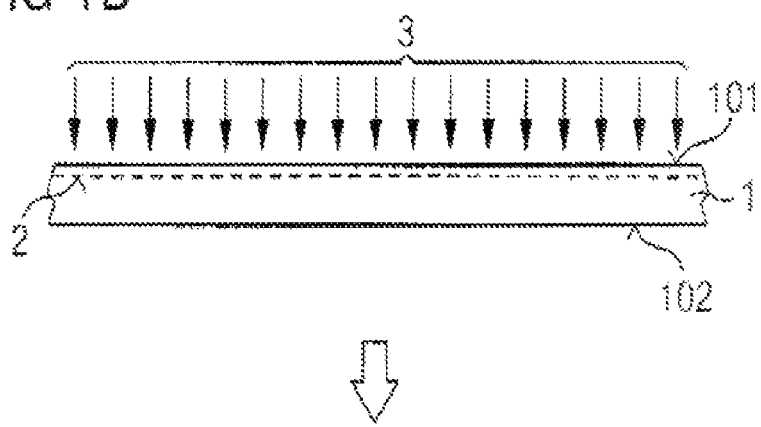

In a second step, illustrated in FIG. 1B, a separation zone 2 disposed along first main face 101 is formed in growth substrate wafer 1. This is preferably effected by ion implantation (for example with hydrogen ions) through the first main face 101 of growth substrate wafer 1 (indicated by the arrows 3). The separation zone 2 is here located in the ion-implanted region of the growth substrate wafer 1. Such a method is described for example in the documents U.S. Pat. No. 5,374,564 and U.S. Pat. No. 6,103,597, whose disclosure content in this regard is hereby incorporated by reference.

When formed in a flat growth substrate wafer 1, the separation zone 2 generates a stress that results in a convex bowing of the first main face 101. In the case of a growth substrate wafer 1 comprising for example GaN, the bowing produced by the formation of the separation zone 2 in a flat growth substrate wafer 1 is ordinarily of such magnitude that the radius R of curvature of the first main face 101 assumes a value between 3 m and 35 m, particularly between 6 m and 10 m, limits included. In the case of a growth substrate wafer with a diameter of 2 inches, this curvature roughly corresponds to a maximum distance a of the first main face 101 from a planar sublayer 16 that assumes a value between 10 μm and 100 μm, particularly between 30 μm and 60 μm, limits included.

The stress exhibited by the growth substrate wafer 1 prior to the formation of the separation zone counteracts the stress generated by the formation of the separation zone 2. The cumulative effect is that after the incorporation of the separation zone 2, the first and second main faces of the growth substrate wafer deviate only slightly or not at all from a planar surface. A "slight deviation" is to be understood herein as for example a radius R of curvature of the first main face 101 that has a value R greater than or equal to 35 m. Particularly preferably, the radius R of curvature has a value greater than or equal to 70 m. In the case of a growth substrate wafer with a diameter of 2 inches, this curvature roughly corresponds to a maximum distance a of the first main face 101 from a planar sublayer 16 that is less than or equal to 10 μm, particularly preferably less than or equal to 5 μm.

Figure 1C:
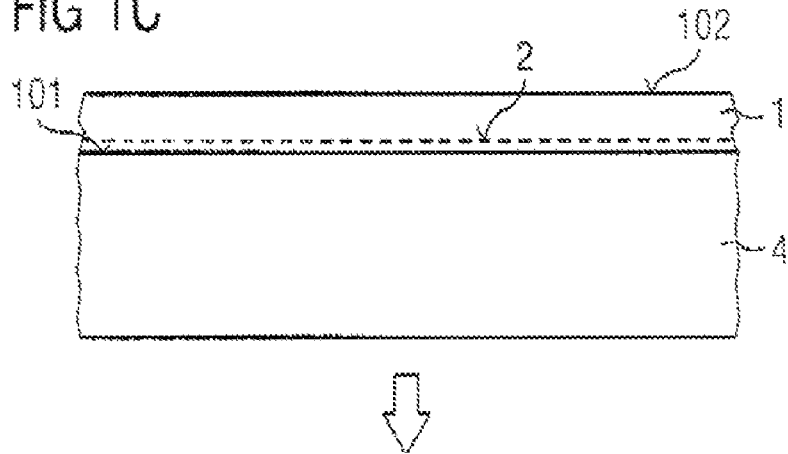

The growth substrate wafer 1 is then bonded to a subcarrier wafer 4, specifically preferably such that first main face 101 is facing subcarrier wafer 4 (see FIG. 1C). The bond between the growth substrate wafer 1 and the subcarrier wafer 4 can be produced for example by means of a bonding layer (not shown). Said bonding layer can be a dielectric layer, which in the present case is preferably based on silicon oxide and/or silicon nitride or consists of silicon oxide and/or silicon nitride. The bonding layer can also comprise or consist of at least one metal oxide and/or metal nitride.

The subcarrier wafer 4 is transparent to electromagnetic radiation, particularly to laser radiation that may be used for a subsequent laser ablation process. The subcarrier wafer 4 is preferably transparent to a wavelength range less than or equal to 360 nm. The subcarrier wafer 4 is preferably matched to the growth substrate wafer 1 with respect to its thermal expansion coefficient. The subcarrier wafer 4 consists for example substantially of sapphire and/or AlN. The subcarrier wafer 4 can advantageously be polycrystalline.

In a further step of the method, a portion 110 of the growth substrate wafer 1 that faces away from subcarrier wafer 4, as viewed from separation zone 2, is detached, preferably thermally cleaved, along separation zone 2. This is illustrated in FIG. 1D. Here again, such a method is described for example in the documents U.S. Pat. No. 5,374,564 and U.S. Pat. No. 6,103,597, whose disclosure content in this regard is hereby incorporated by reference.

In the present case, the quasi-substrate wafer 17 includes the subcarrier wafer 4 and the portion 120 of the growth substrate wafer 1 which remains on the subcarrier wafer, and which can serve as a growth layer, for example for subsequent epitaxial growth of a semiconductor layer sequence.

The parting surface of the portion 120 of growth substrate wafer 1 that remains on subcarrier wafer 4 and is laid bare by the detachment of the portion 110 of growth substrate wafer 1 that faces away from subcarrier wafer 4, as viewed from separation zone 2, is then prepared, for example by etching and/or grinding, such that it is suitable for use as a growth surface 121 for the epitaxial growth of a semiconductor layer sequence for the intended semiconductor structures.

In the second exemplary embodiment of the first method, a second zone 12 is formed in the growth substrate wafer 1, as illustrated in FIG. 2. This is disposed along the second main face 102 of growth substrate wafer 1, which second face is located opposite the first main face 101 of growth substrate wafer 1. The second zone 12 is preferably formed in the same manner as the separation zone 2, that is, preferably by ion implantation, for example with hydrogen ions. Both the separation zone 2 and the second zone 12 each generate a stress in the growth substrate wafer 1. However, the stresses generated by the formation of the separation zone and by the formation of the second zone bring about a first and a second change in the radius R of curvature of the first main face 101 of the growth substrate wafer 1 that are opposite in direction, so that the cumulative effect is to yield only slight or no bowing of the growth substrate wafer 1.

If, after bonding to the subcarrier wafer 4 has been completed, the portion 110 of growth substrate wafer 1 that faces away from subcarrier wafer 4, as viewed from separation zone 2, is detached along separation zone 2, the portion of growth substrate wafer 1 disposed between the second main face 102 and the second zone 12 can also simultaneously be detached. For example, a substantially planar growth substrate wafer is then again obtained.

In a third exemplary embodiment of the first method, a stressed layer 13 is applied to the second main face 102 of the growth substrate wafer 1, as illustrated in FIG. 3. The stressed layer 13 can for example be a dielectric layer. It can also comprise or consist of at least one metal nitride and/or metal oxide. In the present case, the stressed layer comprises or consists of at least one of the following materials: SiN, SiO, TiN. The stressed layer 13 is preferably compressively stressed. The magnitude of the stress can be adjusted by means of the process parameters selected for the application of the layer 13. Such process parameters are for example the layer thickness and deposition parameters, by means of which for example the density and/or the expansion coefficient of the stressed layer 13 can be adjusted. The thickness of the stressed layer 13 is preferably less than or equal to 5 μm, particularly preferably less than or equal to 1 μm.

In a planar growth substrate wafer 1, the compressively stressed layer 13 generates a stress that produces a concave bowing of the first main face 101. A bowing of opposite direction is induced by the formation of the separation zone 2, and the growth substrate wafer 1 thus is substantially planar after the formation of the separation zone 2 and the application of the stressed layer 13. Said application of the stressed layer 13 can take place before or after the formation of the separation zone 2.

Figure 4A:
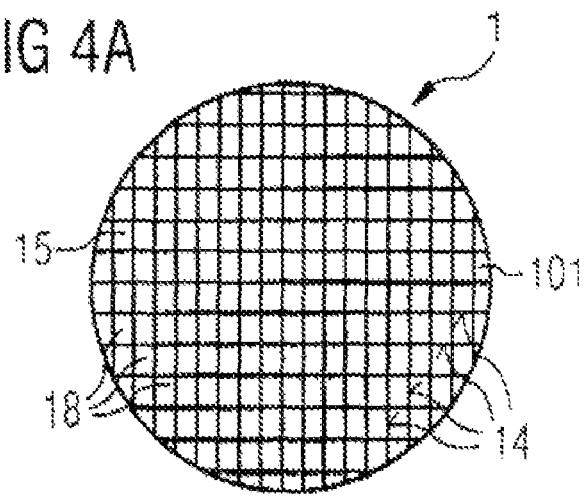
FIG. 4A is a schematic plan view of a growth substrate wafer during a method step according to a first exemplary embodiment of the second inventive method.

According to a first exemplary embodiment of the second inventive method, the first main face 101 of the growth substrate wafer 1 is structured by means of a rectangular grid 15, as illustrated in FIG. 4A. The structuring of the first main face 101 preferably takes place after the formation of the separation zone 2.

Figure 4B:
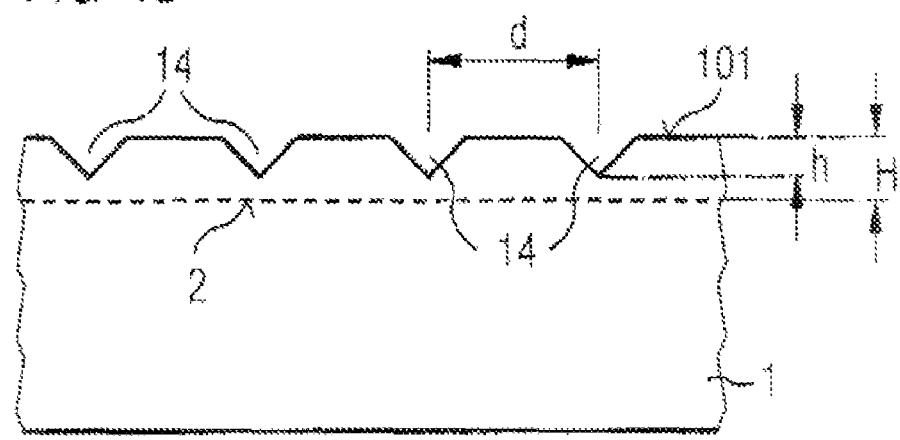
FIG. 4B is a schematic sectional representation of a growth substrate wafer during the method step of FIG. 4A.

The grid 15 is produced for example by etching excavations 14 into the first main face 101 of the growth substrate wafer 1 (cf. FIG. 4B). In the present case, said excavations 14 are implemented as trenches. The intersection points of such trenches 14 define grid points. Subregions 18 of the structure are bounded by the trenches 14 and contain no additional grid points.

Side lengths d of the subregions 18 of the structure are given in this case by the distance between two adjacent grid points. The side lengths d of the subregions 18 are preferably selected to be so large, at least in sections of the first main face 101 of the growth substrate wafer 1 that are intended for subsequent growth of a semiconductor body, that a semiconductor body can be formed entirely within a subregion 18 of the grid. In the present case the side lengths d are preferably between 10 μm and 1 cm, limits included.

The excavations 14 have for example a depth h of 5 μm or less. Said depth h is preferably less than or equal to 1 μm; particularly preferably, h is less than or equal to 0.5 μm.

The depth h of the trenches 14 is selected in the present case so as to be smaller than the distance H between the first main face 101 of the growth substrate wafer 1 and the separation zone 2. If the portion 110 of the growth substrate wafer 1 that is farther from the subcarrier substrate 4, as viewed from the separation zone 2, is detached along the separation zone 2, as illustrated in FIG. 1D, a closed growth surface 121 is still obtained in spite of the structuring of the first main face 101 by means of the trenches 14.

Figure 5:
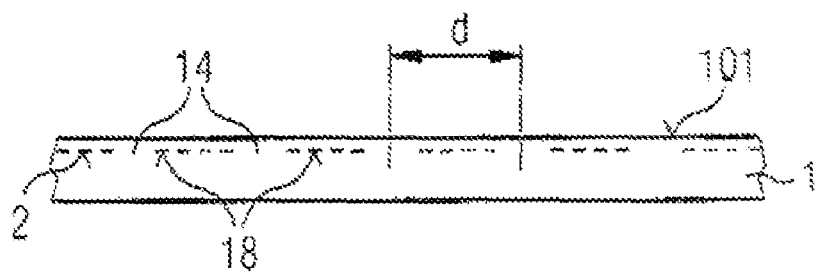
FIG. 5 is a schematic sectional representation of a growth substrate wafer during a method step according to a second exemplary embodiment of the second method.

In the second exemplary embodiment of the second method, illustrated in FIG. 5, the separation zone 2 formed in the growth substrate wafer 1 is structured. As in the structuring of the first main face 101, the structure of the separation zone 2 preferably represents a parallelogram-like, rectangular, square or triangular grid 15.

The structuring of the separation zone 2 is produced by applying a masking layer to first main face 101 of growth substrate wafer 1 prior to the ion implantation, thereby preventing the penetration of ions during implantation, preferably in linear sections 14 of first main face 101. Ions are thereby implanted in the growth substrate 1 substantially at the unmasked locations of the first main face 101.

This results in the formation of a separation zone 2 that comprises, along the first main face 101, a plurality of subregions 18 of side lengths d in which ions are implanted. These subregions 18 are surrounded by additional, preferably linear sections 14 containing no implanted ions. The subregions 18 of the structured separation zone 2 are preferably parallelogram-like, rectangular, square or triangular.

The invention is not limited to the exemplary embodiments by the description made with reference thereto. Rather, the invention encompasses any novel feature or any combination of features, including in particular any combination of features recited in the claims, even if that feature or combination itself is not explicity mentioned in the claims or exemplary embodiments.

The invention claimed is:

1. A method of fabricating a quasi-substrate wafer with a subcarrier wafer and a growth layer, the method comprising:
    providing a growth substrate wafer comprising a desired material of said growth layer and having a first main face and a second main face,
    forming a separation zone disposed along said first main face in said growth substrate wafer, the formed separation zone configured to cause a stress that leads to a first change in the radius (R) of curvature of said first main face of said growth substrate wafer;
    providing said growth substrate wafer with another stress that causes a second change in the radius (R) of curvature of said first main face of said growth substrate wafer, said second change in the radius (R) of curvature being opposite in direction to said first change in the radius (R) of curvature;
    bonding said growth substrate wafer to a subcarrier wafer with said first main face of said growth substrate wafer facing said subcarrier wafer;
    detaching a portion of said growth substrate wafer that faces away from said subcarrier wafer, as viewed from said separation zone along said separation zone.

2. The method as in claim 1, wherein said first change in the radius (R) of curvature and said second change in the radius (R) of curvature substantially cancel each other out.

3. The method as in claim 1, wherein the growth substrate wafer already exhibits at the time of providing the growth substrate wafer the other stress that leads to the second change in the radius (R) of curvature, so that said first main face of said provided growth substrate wafer is curved.

4. The method as in claim 3, wherein said provided growth substrate wafer is stressed such that its first main face exhibits a concave curvature.

5. The method as in claim 1, further comprising forming a second zone along said second main face of said growth substrate wafer said second zone configured to generate in said growth substrate wafer the other stress that causes the second change in the radius (R) of curvature of said first main face of said growth substrate wafer that is opposite in direction to said first change in the radius (R) of curvature.

6. The method as in claim 5, wherein said second zone is formed in the same manner as said separation zone.

7. The method as in claim 5, wherein said separation zone and said second zone are disposed symmetrically or nearly symmetrically to a plane that extends centrally between said first main face and said second main face of said growth substrate wafer, said second main face being disposed oppositely to said first main face.

8. The method as in claim 1, further comprising applying a stressed layer to at least one of said first main face and said second main face of said growth substrate wafer, said stressed layer configured to generate in said growth substrate wafer the other stress that causes the second change in the radius (R) of curvature of said first main face of said growth substrate wafer that is opposite in direction to said first change in the radius (R) of curvature.

9. The method as in claim 8, wherein said stressed layer is applied to said second main face of said growth substrate wafer.

10. The method as in claim 9, wherein said stressed layer is compressively stressed.

11. The method as in claim 8, wherein said stressed layer is applied to said first main face of said growth substrate wafer.

12. The method as in claim 11, wherein said stressed layer is tensilely stressed.

13. The method as in claim 8, wherein said stressed layer applied to said at least one of said first main face and said second main face of said growth substrate wafer is a dielectric layer.

14. The method as in claim 8, wherein said stressed layer applied to said at least one of first main face and second main face of said growth substrate wafer comprises at least one element selected from the group consisting of: metal oxide, and metal nitride.

15. The method as in claim 13, wherein said layer applied to said at least one of said first main face and said second main face of said growth substrate wafer comprises at least one of the following materials: SiN, SiO, TiN.

16. The method as in claim 1 further comprising distributing said stress generated in said growth substrate wafer by the formation of said separation zone substantially to a plurality of subregions disposed along said first main face, wherein distributing said stress comprises structuring at least one element selected from the group consisting of said first main face, and said separation zone.

17. The method as in claim 1, further comprising fabricating a growth substrate wafer with separation zone whose first main face has a radius (R) of curvature greater than or equal to 35 meters.

18. The method as in claim 17, wherein the radius (R) of curvature of said first main face of said growth substrate wafer with separation zone is greater than or equal to 70 meters.

19. The method as in claim 1, wherein said growth substrate wafer comprises a nitride III compound semiconductor material.

20. The method as in claim 1, wherein said separation zone is produced by ion implantation.

21. The method as in claim 20, wherein the ions implanted are hydrogen ions.

22. The method as in claim 20, wherein the dose of implanted ions has a value equal to or greater than $10^{17}$ ions/cm$^3$.

23. The method as in claim 1, wherein said stress generated in said growth substrate wafer by the formation of said separation zone is so selected that the formation of an unstructured separation zone in a flat growth substrate wafer bows its first main face such that it has a radius (R) of curvature between 3 m and 35 m.

24. The method as in claim 1, wherein the bond between said growth substrate wafer and said subcarrier wafer is produced by means of a bonding layer which is a dielectric layer.

25. The method as in claim 24, wherein said bond between said growth substrate wafer and said subcarrier wafer is produced using a bonding layer based on an element selected from the group consisting of: silicon oxide, and silicon nitride.

26. The method as in claim 1, wherein said bond between said growth substrate wafer and said subcarrier wafer is produced using a bonding layer comprising at least one element selected from the group consisting of: metal oxide, and metal nitride.

27. The method as in claim 1, wherein said portion of said growth substrate wafer that faces away from said subcarrier wafer, as viewed from said separation zone, is thermally cleaved along said separation zone.

28. The method as in claim 1 further comprising forming a growth surface for subsequent epitaxial growth of a semiconductor layer sequence on the portion of said growth substrate wafer that remains on said subcarrier wafer.

29. The method as in claim 28, wherein forming said growth surface comprises at least one of etching said growth surface and/or grinding said growth surface.

30. The method as in claim 1, wherein said separation zone and said second zone are produced by ion implantation.

* * * * *

UNITED STATES PATENT AND TRADEMARK OFFICE
CERTIFICATE OF CORRECTION

PATENT NO. : 8,012,256 B2  
APPLICATION NO. : 11/668718  
DATED : September 6, 2011  
INVENTOR(S) : Georg Brüderl, Christoph Eichler and Uwe Strauss Page 1 of 1

It is certified that error appears in the above-identified patent and that said Letters Patent is hereby corrected as shown below:

Title Page; (73) Assignee, first page, column 1, line 1, please delete "Semiconductor" and insert -- Semiconductors --.

Title Page; (57) Abstract, first page, column 2, line 5, delete "water" and insert -- wafer --.

Title Page; (57) Abstract, first page, column 2, line 11, delete "race" and insert -- face --.

Title Page; (57) Abstract, first page, column 2, line 11 delete "water" and insert -- wafer --.

In Claim 5, column 10, line 61, delete "wafer said" and insert -- wafer, said --.

Signed and Sealed this  
Fifteenth Day of November, 2011

David J. Kappos  
*Director of the United States Patent and Trademark Office*